US012616000B2

(12) United States Patent
Chen et al.

(10) Patent No.: US 12,616,000 B2
(45) Date of Patent: Apr. 28, 2026

(54) SEMICONDUCTOR WAFER CLEANING APPARATUS

(71) Applicant: Taiwan Semiconductor Manufacturing Company, Ltd., Hsinchu (TW)

(72) Inventors: Chia-Lun Chen, Taichung City (TW); Po-Jen Shih, Tainan City (TW); Ming-Sung Hung, Taichung City (TW); Wen-Hung Hsu, Taichung City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 196 days.

(21) Appl. No.: 18/517,194

(22) Filed: Nov. 22, 2023

(65) Prior Publication Data

US 2024/0087878 A1     Mar. 14, 2024

Related U.S. Application Data

(63) Continuation of application No. 17/232,218, filed on Apr. 16, 2021, now Pat. No. 11,854,793, which is a
(Continued)

(51) Int. Cl.
*H01L 21/687* (2006.01)
*B08B 1/36* (2024.01)
(Continued)

(52) U.S. Cl.
CPC .......... *H01L 21/68728* (2013.01); *B08B 1/36* (2024.01); *B08B 1/52* (2024.01);
(Continued)

(58) Field of Classification Search
CPC ................................................. H01L 21/68728
See application file for complete search history.

(56) References Cited

U.S. PATENT DOCUMENTS 4,724,621 A    2/1988  Hobson et al.
9,136,155 B2   9/2015  Kinoshita et al.
(Continued)

FOREIGN PATENT DOCUMENTS

CN          101011805 A    8/2007
CN          205251138 U    5/2016
(Continued)

OTHER PUBLICATIONS

KR20090118672A Machine Translation (Year: 2009).*
(Continued)

*Primary Examiner* — Spencer E. Bell
(74) *Attorney, Agent, or Firm* — McClure, Qualey & Rodack, LLP

(57) ABSTRACT

A semiconductor wafer cleaning apparatus is provided. The semiconductor wafer cleaning apparatus includes a spin base, a spindle extending through the spin base, and a clamping member covering the spin base. The spindle includes a mounting part and a supporting part disposed on the mounting part. The mounting part includes an inner projection, the supporting part includes a conical projection, and the conical projection is surrounded by the inner projection. The semiconductor wafer cleaning apparatus further includes a first sealing ring disposed between the spin base and the mounting part.

20 Claims, 9 Drawing Sheets

Related U.S. Application Data continuation of application No. 15/706,959, filed on Sep. 18, 2017, now Pat. No. 10,991,570.

(51) Int. Cl.

| | |
|---|---|
| *B08B 1/52* | (2024.01) |
| *B08B 3/02* | (2006.01) |
| *H01L 21/02* | (2006.01) |
| *H01L 21/304* | (2006.01) |
| *H01L 21/67* | (2006.01) |

(52) U.S. Cl.
CPC ........ *B08B 3/024* (2013.01); *H01L 21/02057* (2013.01); *H01L 21/0206* (2013.01); *H01L 21/304* (2013.01); *H01L 21/6704* (2013.01); *H01L 21/67051* (2013.01)

(56) References Cited

U.S. PATENT DOCUMENTS

| | | | |
|---|---|---|---|
| 9,536,770 B2 | 1/2017 | Brugger et al. |
| 2007/0187909 A1 | 8/2007 | Troxler |

| | | | |
|---|---|---|---|
| 2015/0200123 A1 | 7/2015 | Brugger et al. |
| 2017/0345684 A1 | 11/2017 | Hohenwarter et al. |

FOREIGN PATENT DOCUMENTS

| | | | | |
|---|---|---|---|---|
| KR | 20090118672 A | * | 11/2009 | ....... H01L 21/68764 |
| TW | 201036102 A1 | | 10/2010 | |
| TW | 201334100 A | | 8/2013 | |
| TW | 201535589 A | | 9/2015 | |

OTHER PUBLICATIONS

Chinese language office action dated Oct. 2, 2018, issued in application No. TW 106135667.

Chinese language office action dated Mar. 18, 2020, issued in application No. CN 201711259487.5.

Chinese language office action dated Dec. 3, 2020, issued in application No. CN 201711259487.5.

* cited by examiner

SEMICONDUCTOR WAFER CLEANING APPARATUS

CROSS REFERENCE TO RELATED APPLICATIONS

This application is a Continuation application of U.S. patent application Ser. No. 17/232,218, filed on Apr. 16, 2021, now U.S. Pat. No. 11,854,793, which is a Continuation of U.S. patent application Ser. No. 15/706,959, now U.S. Pat. No. 10,991,570, filed on Sep. 18, 2017, the entirety of which is incorporated by reference herein.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling-down has also increased the complexity of processing and manufacturing ICs.

ICs are typically fabricated by processing one or more wafers as a "lot" with a series of wafer fabrication tools (i.e., "processing tools"). Each processing tool typically performs a single wafer fabrication task on the wafers in a given lot. For example, a particular processing tool may perform layering, patterning and doping operations or thermal treatment. A layering operation typically adds a layer of a desired material to an exposed wafer surface. A patterning operation typically removes selected portions of one or more layers formed by layering. A doping operation typically incorporates dopants directly into the silicon through the wafer surface, to produce p-n junctions. A thermal treatment typically heats a wafer to achieve specific results (e.g., dopant drive-in or annealing).

Although existing processing tools have been generally adequate for their intended purposes, they have not been entirely satisfactory in all respects. Consequently, there is a need for a processing tool and a method thereof for using it that provides a solution for processing ICs efficiently and stably.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
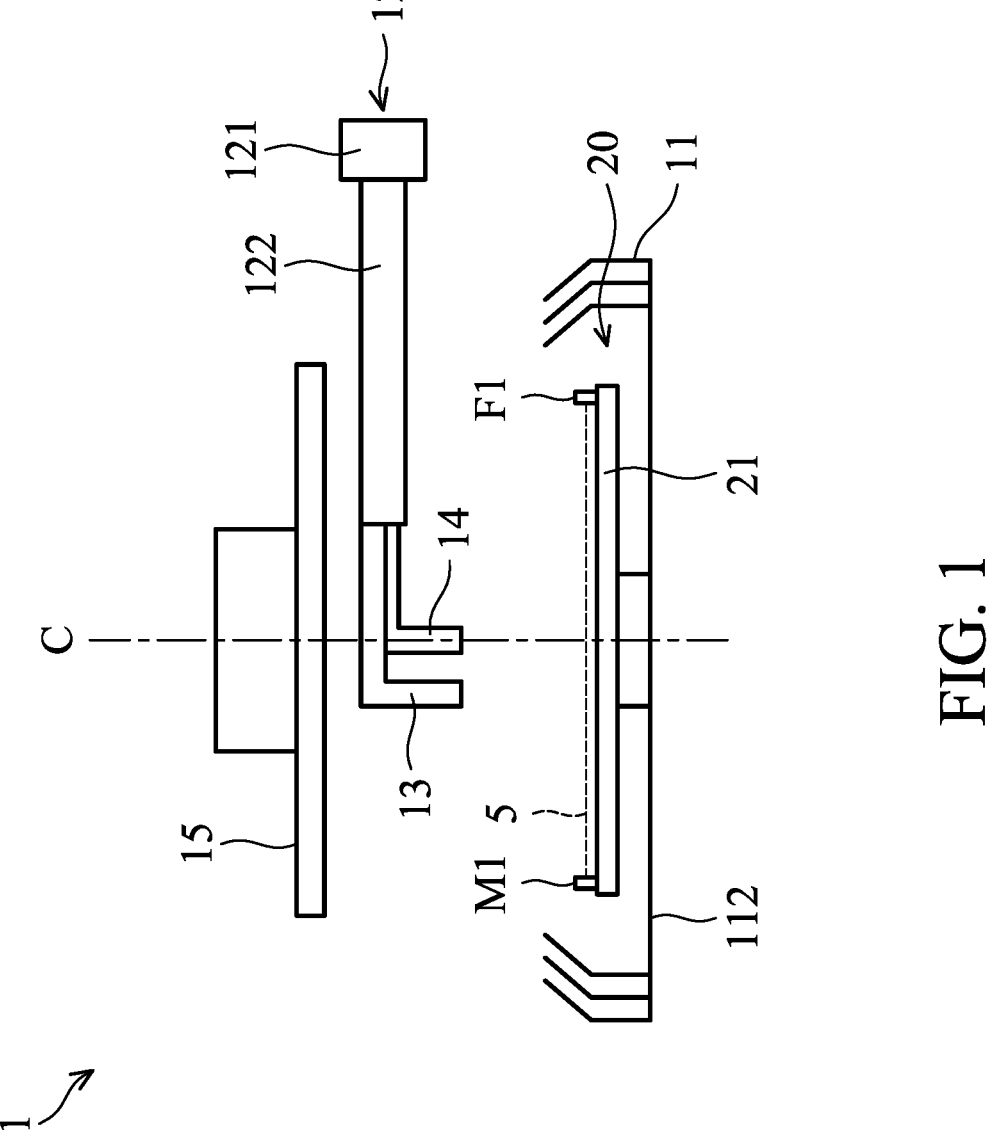
FIG. 1 is a schematic diagram of a processing system in semiconductor fabrication, in accordance with some embodiments.

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

FIG. 1 shows a schematic view of a processing system 1, in accordance with some embodiments. The processing system 1 is configured to clean one or more wafers 5. In some embodiments, the processing system 1 includes a catch cup 11, a transferring module 12, a number of supply units, (such as a first supply unit 13, a second supply unit 14), a shield plate 15 and a spin chuck 20. Additional features can be added to the wafer process system, and some of the features described below can be replaced or eliminated in other embodiments of the wafer process system.

In some embodiments, the catch cup 11 is configured to provide an environment for cleaning the semiconductor wafer 5. The catch cup 11 is a circular cup having an open top. The upper portion of the cup wall tilts inward to facilitate retaining waste within the catch cup 11. The catch cup 11 is connected to an exhaust system via a liquid waste drain formed on the bottom wall 112. As a result, the catch cup 11 is able to catch and drain waste liquid solution for the wafer cleaning process via the liquid waste drain.

The spin chuck 20 is disposed in the catch cup 11. In some embodiments, the spin chuck 20 is configured for holding, positioning, moving, rotating, and otherwise manipulating the semiconductor wafer 5. In some embodiments, the spin chuck 20 is arranged to move along a main axis C. The semiconductor wafer 5 may be secured on the spin chuck 20 by a clamping mechanism 20. The spin chuck 20 is designed and configured to be operable for translational and rotational motions. In some embodiments, the spin chuck 20 is further designed to tilt or dynamically change the tilt angle. In some embodiments, the spin chuck 20 is fitted with a suitable heating mechanism to heat the semiconductor wafer 5 to a desired temperature.

Figure 2:
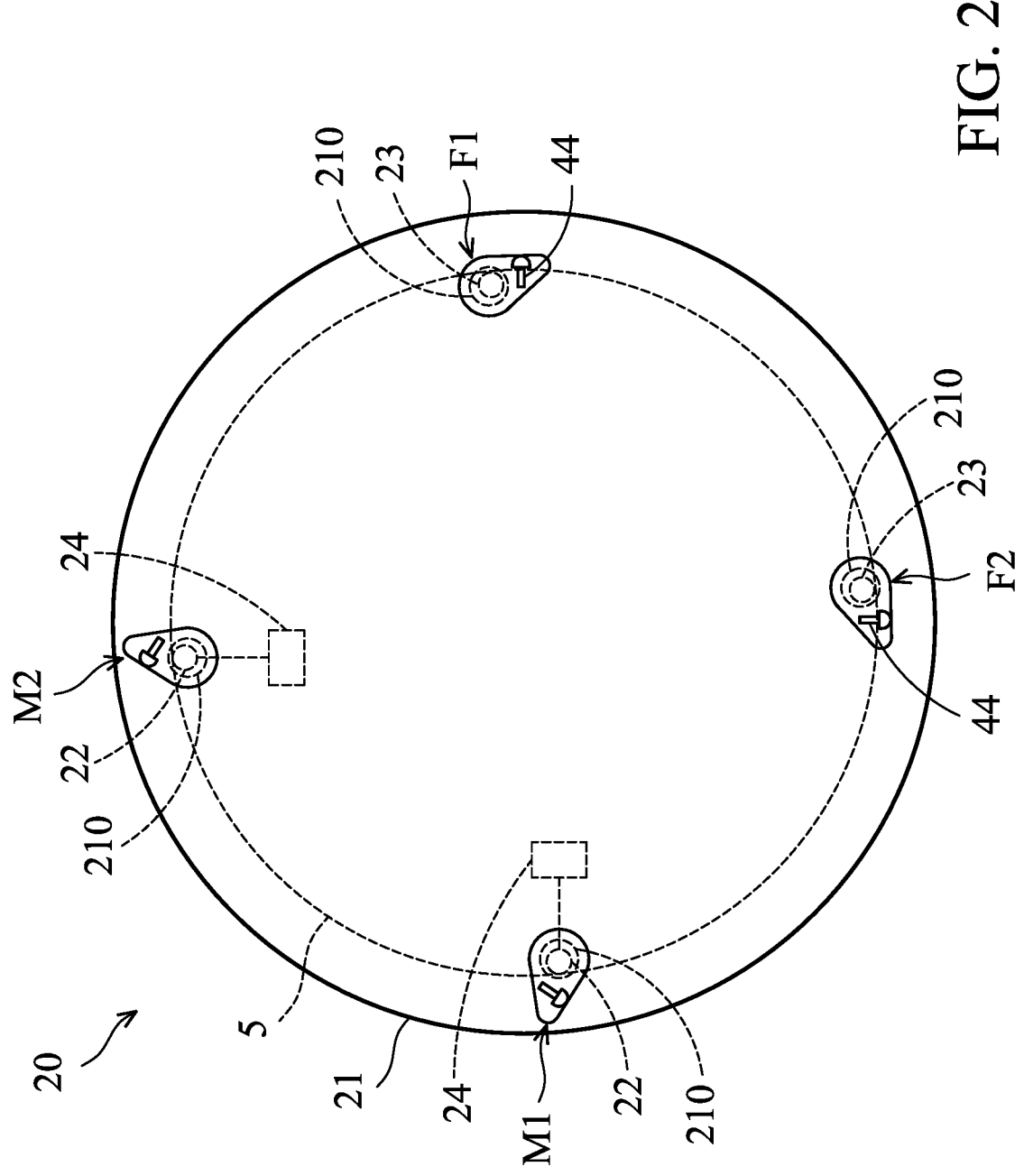
FIG. 2 shows a top view of the spin chuck as two movable clamping members are in open positions, in accordance with some embodiments.
Figure 3:
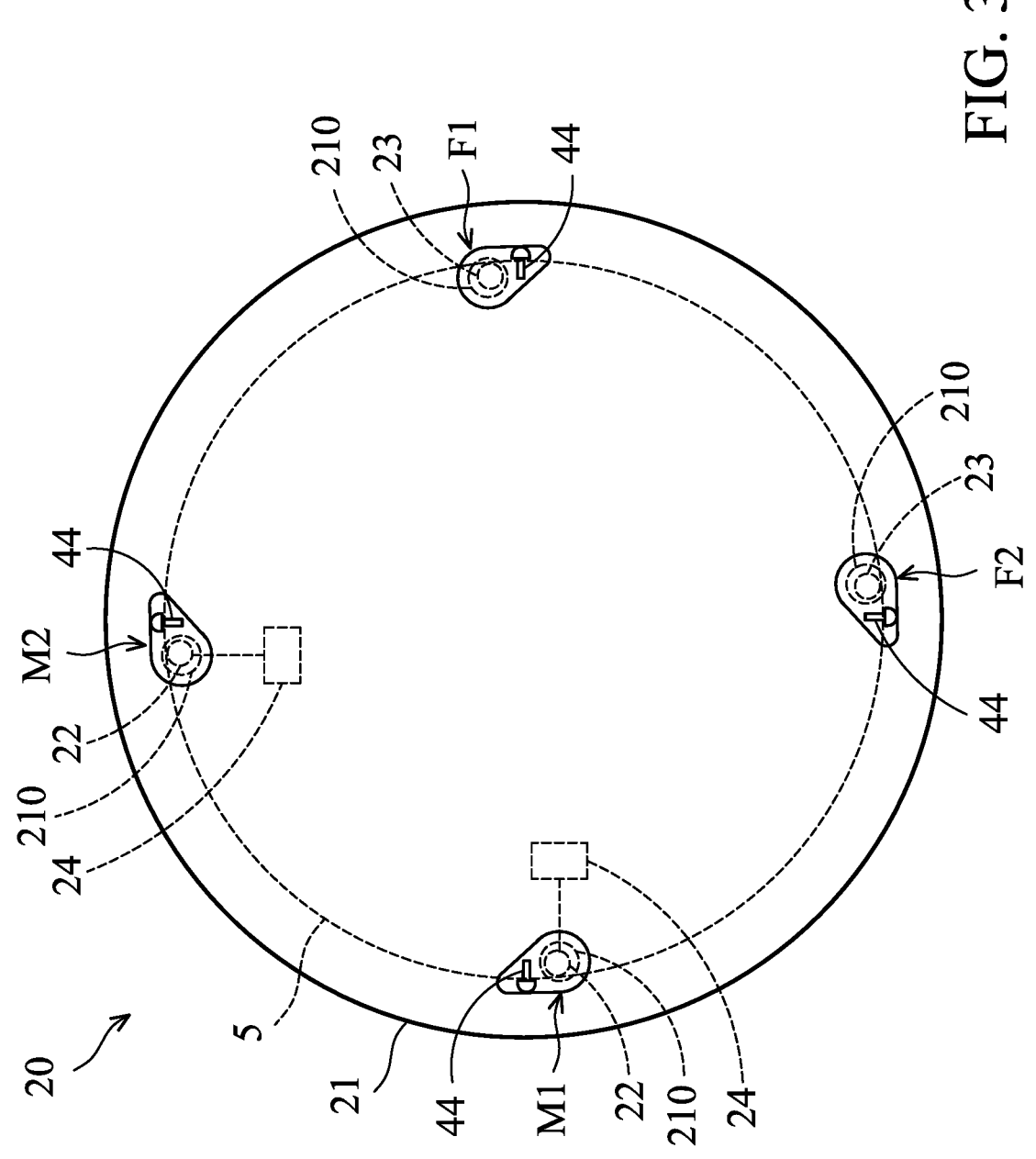
FIG. 3 shows a top view of the spin chuck as two movable clamping members are in closed positions, in accordance with some embodiments.

FIG. 2 shows a top view of the spin chuck 20 as movable clamping member M1 and movable clamping member M2 are in an open position. FIG. 3 shows a top view of the spin chuck 20 as movable clamping member M1 and movable clamping member M2 are in a closed position. In some embodiments, the spin chuck 20 includes a disk-shaped spin base 21. The spin base 21 includes a number of through holes 210 formed on a peripheral edge portion of the spin base 21. The through holes 210 are arranged at equidistant intervals around the circumference of the spin base 21. In the ceases that there are four through holes 210 formed on the spin base 21, the two neighboring through holes 210 are spaced at an angular interval of about 90 degrees.

In some embodiments, the spin chuck 20 further includes a number of rotatable spindles, for example it may include two rotatable spindles 22. The two rotatable spindles 22 are positioned relative to two of the through holes 210 that are positioned adjacent to each other and pass through the two through holes 210. In addition, the spin chuck 20 further includes a number of fixed spindles, for example it may include two fixed spindles 23. The two fixed spindles 23 are positioned in the other two through holes 210 and pass through the two through holes 210. The two fixed spindles 23 are affixed to the spin base 21.

In some embodiments, the spin chuck 20 further includes a number of driving members, such as two driving members 24. The two driving members 24 are configured to change the rotation angle of the rotatable spindles 22. The two driving members 24 may be positioned in the spin base 21 and connected to the two rotatable spindles 22 with or without a transmission mechanism (not shown in figures). The driving members 24 may include motors that generate a driving torque by using electricity. The driving members 24 may be connected to a controller (not shown in figures) to receive driving signals to change the rotation angle of the rotatable spindles 22.

In some embodiments, the spin chuck 20 further includes a number of fixed clamping members, such as fixed clamping member F1 and fixed clamping member F2. Fixed clamping member F1 and fixed clamping member F2 are positioned relative to the two through holes 210 in which the two fixed spindles 23 are located. Fixed clamping member F1 and fixed clamping member F2 are connected to the two fixed spindles 23 and cover the two corresponding through holes 210.

Additionally, the spin chuck 20 includes a number of movable clamping members, such as movable clamping member M1 and movable clamping member M2. Movable clamping member M1 and movable clamping member M2 are positioned relative to the two through holes 210 in which the two rotatable spindles 22 are located. Movable clamping member M1 and movable clamping member M2 are connected to the two rotatable spindles 22 and cover the two corresponding through holes 210.

In some embodiments, the two rotatable spindles 22 and the two fixed spindles 23 are positioned at two opposite sides of the spin base 21. Therefore, fixed clamping member F1 and fixed clamping member F2 are spaced at an angular interval of about 90 degrees, and movable clamping member M1 and movable clamping member M2 are spaced at an angular interval of about 90 degrees, as shown in FIG. 2.

However, it should be appreciated that many variations and modifications can be made to embodiments of the disclosure. In some other embodiments, the two rotatable spindles 22 and the two fixed spindles 23 are arranged in such a way that they alternate in the circumferential direction of the spin base 21. Therefore, fixed clamping member F1 and fixed clamping member F2 are spaced at an angular interval of about 180 degrees, and movable clamping member M1 and movable clamping member M2 are spaced at an angular interval of about 180 degrees.

In some embodiments, movable clamping member M1 and movable clamping member M2 may operate independently of fixed clamping member F1 and fixed clamping member F2. For example, fixed clamping member F1 and fixed clamping member F2 are affixed to the spin base 21. Fixed clamping member F1 and fixed clamping member F2 are not able to rotate relative to the spin base 21, and the rotation angles of fixed clamping member F1 and fixed clamping member F2 are fixed. On the other hand, movable clamping member M1 and movable clamping member M2 are operated associated with each other to clamp and unclamp the semiconductor wafer 5. The rotation angle of the clamping members M1 and M2 can be changed by rotating the rotatable spindles 23.

As a result, as shown in FIG. 2, when fixed clamping member F1 and fixed clamping member F2 clamp the semiconductor wafer 5 at circumferential positions of the semiconductor wafer 5 spaced at an angular interval of about 90 degrees, the clamping members M1 and M2 may unclamp the semiconductor wafer 5. Alternatively, as shown in FIG. 3, the semiconductor wafer 5 is simultaneously clamped by fixed clamping member F1, fixed clamping member F2, movable clamping member M1, and movable clamping member M2. In such cases, the semiconductor wafer 5 is clamped at four circumferential positions of the semiconductor wafer 5 spaced at an angular interval of about 90 degrees.

Figure 4:
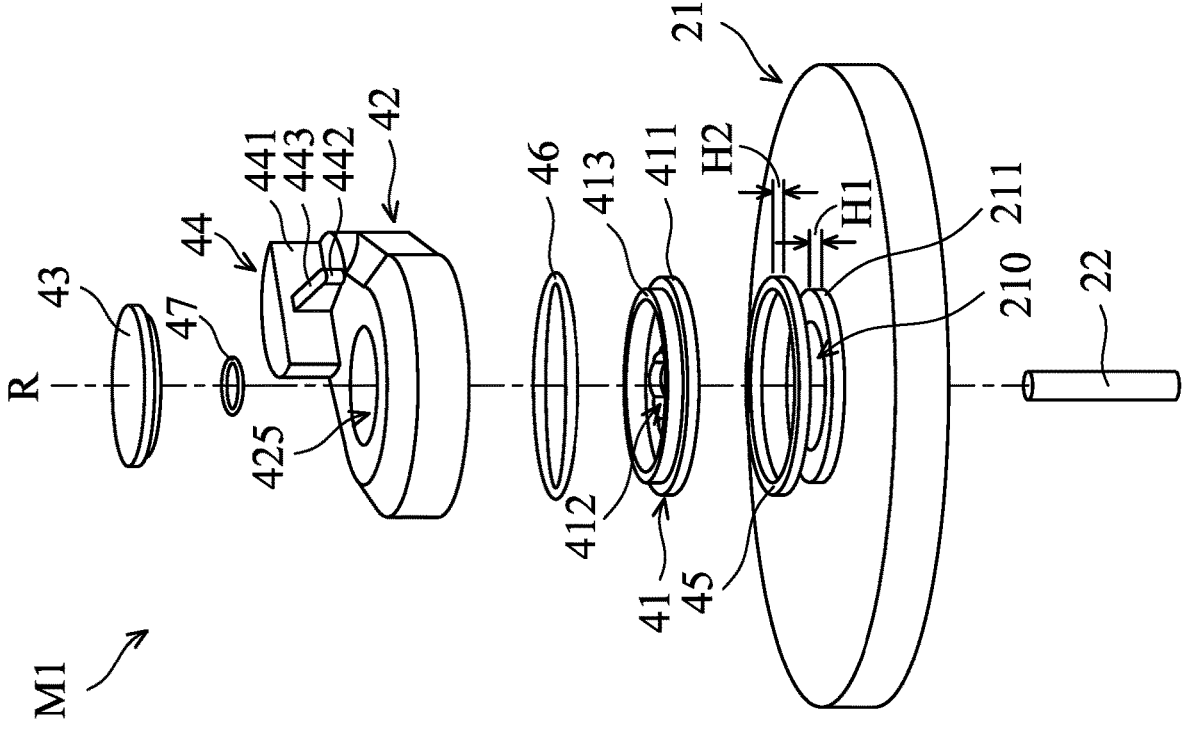
FIG. 4 shows an exploded view of a clamping member, a portion of a spin base and a rotatable spindle, in accordance with some embodiments.
Figure 5:
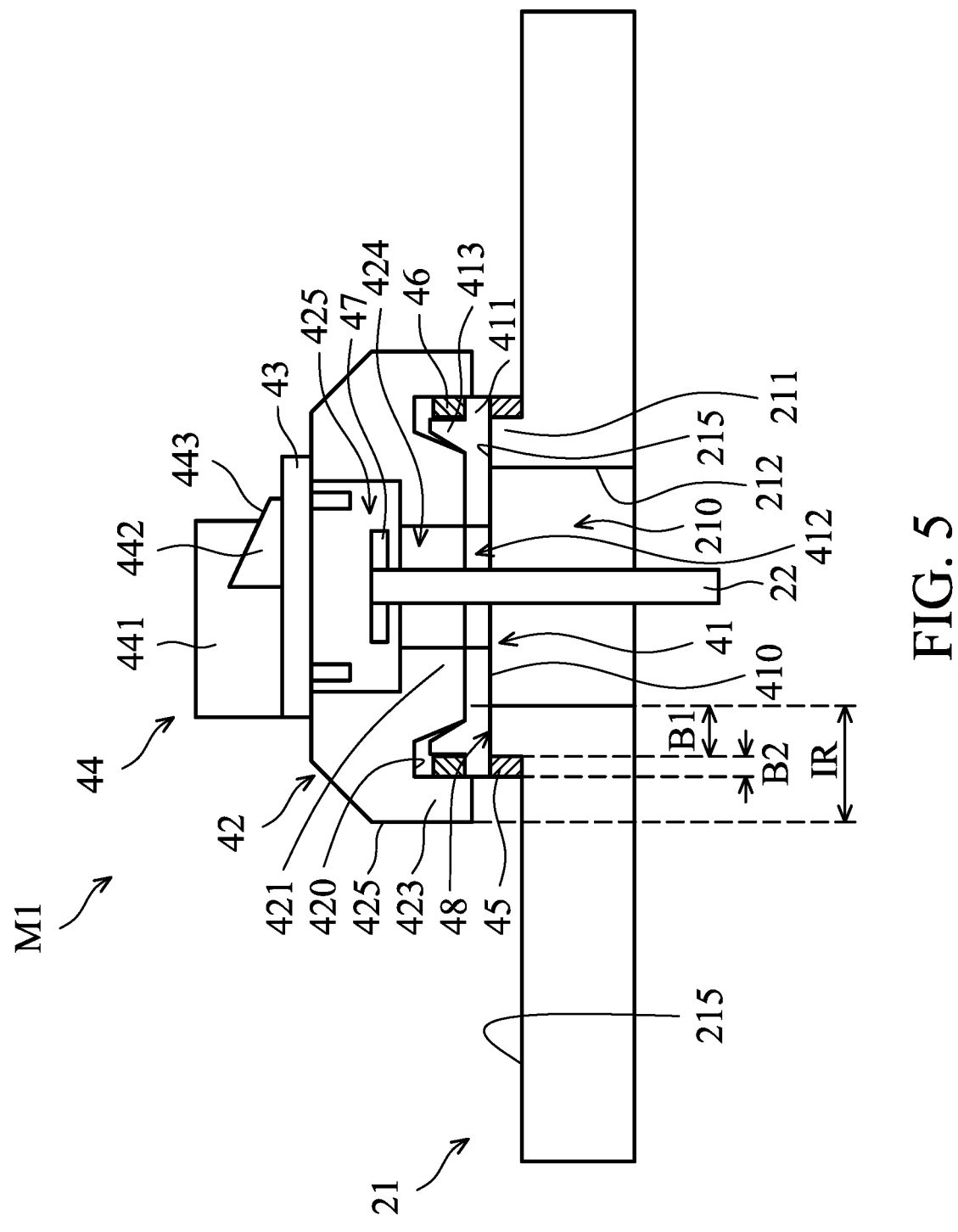
FIG. 5 shows a cross-sectional view of a clamping member, a portion of a spin base and a rotatable spindle, in accordance with some embodiments.

FIG. 4 shows an exploded view of the movable clamping member M1, a portion of the spin base 21, and the rotatable spindle 22, in accordance with some embodiments. FIG. 5 shows a cross-sectional view of the movable clamping member M1, a portion of the spin base 21 and the rotatable spindle 22, in accordance with some embodiments. In some embodiments, the movable clamping member M1 includes a mounting part 41, a supporting part 42, a cover 43, an abutment part 44, a number of sealing rings, such as first sealing ring 45 and second sealing ring 46, and a fastening unit 47. The elements of the movable clamping member M1 can be added to or omitted, and the invention should not be limited by the embodiment.

In some embodiments, the spin base 21 has a number of flanges 211 (only one flange 211 is shown in FIG. 4). The flanges 211 are protruded upward from the edges of the corresponding through hole 210, and the flanges 211 are directly connected to the inner wall 212 (FIG. 5) of the corresponding through hole 210. In some embodiments, as shown in FIG. 4, each of the flanges 211 has a height H1 in a vertical direction.

The first sealing ring 45 is configured to isolate chemical liquid from flowing into the through hole 210. In some embodiments, the first sealing ring 45 is positioned at an outer side of the flanges 211 in the circumferential direction (perpendicular to a rotation axis R of the movable clamping member M1) of the movable clamping member M1. In some embodiments, the first sealing ring 45 surrounds the outer wall of the flange 211. As shown in FIG. 4, the first sealing ring 45 has a height H2. The height H2 may be equal to the height H1, and an inner radius of the first sealing ring 45 is equal to or slightly smaller than an outer radius of the flange 211.

However, it should be appreciated that many variations and modifications can be made to embodiments of the disclosure. The height H2 may be slightly higher than the height H1, and when the first sealing ring 45 is compressed by the movable clamping member M1 after the assembly, the compressed first sealing ring 45 may has the same height as the height H1. The first sealing ring 45 may be an O-ring of a neoprene/silicon blend elastomeric material of circular, shape, and may be hollow or solid.

In some embodiments, the mounting part 41 includes a base plate 411 and an inner projection 413. As shown in FIG. 5, the base plate 411 of the mounting part 41 is placed on the flange 211 in a moveable manner. The outer wall of the base plate 411 may be flush with the first sealing ring 45. Alternatively, the outer side wall of the base plate 411 may be located farther away from the rotatable spindle 22 than the first sealing ring 45.

In some embodiments, a bottom surface 410 of the mounting part 41 of the movable clamping member M1 includes an intermediate region B1 and an edge region B2. The intermediate region B1 is connected to the flange 211 and has a shape corresponding to that of the flange 211. A gap 48 that communicates with the through hole 210 is formed between the intermediate region B1 of the bottom surface 410 and the flange 211 of the spin base 21. The edge region B2 is located between the intermediate region B1 and an outer edge of the bottom surface 410.

In some embodiments, the first sealing ring 45 is positioned adjacent to the gap 48 to block a chemical liquid from flowing into the through hole 210 and is located farther away from the through hole 210 than the gap 48. In addition, at least partial area of the edge region B2 is covered by the sealing ring 45. That is, the sealing ring 45 is in direct contact with the edge region B2 of the bottom surface 410 of the mounting part 41.

The base plate 411 has a lower channel 412 formed corresponding to the through hole 210 and extends along the rotation axis R of the movable clamping member M1. The inner projection 413 has a non-symmetrical, trapezoidal cross-section with one vertical outer side wall. The inner projection 413 surrounds the lower channel 412 and protruding from the base plate 411 along a vertical direction that is parallel to the rotation axis R of the movable clamping member M1.

In some embodiments, the supporting part 42 is placed on the mounting part 41. As shown in FIG. 5, the supporting part 42 includes a conical projection 421 formed on a bottom surface 420 of the supporting part 42. The outer side wall of the conical projection 421 is substantially supplementary to a neighboring side wall of the inner projection 413.

In addition, the supporting part 42 includes an outer projection 423 formed at an edge of the bottom surface 420 of the supporting part 42. The outer projection 423 is located away from the conical projection 421. The outer projection 423 protrudes from the bottom surface 420 of the supporting part 42 along the vertical direction that is parallel to the rotation axis R of the movable clamping member M1.

In some embodiments, in the circumferential direction of the movable clamping member M1, the outer projection 423 is spaced from the inner projection 413 by a distance. The second sealing ring 46 is positioned between the outer projection 423 and the inner projection 413. The distance between the outer projection 423 and the inner projection 413 may be equal to the width of the second sealing ring 46 in the circumferential direction of the movable clamping member M1.

However, it should be appreciated that many variations and modifications can be made to embodiments of the disclosure. The distance between the outer projection 423 and the inner projection 413 may be slightly less than the width of the second sealing ring 46 in the circumferential direction of the movable clamping member M1. When the second sealing ring 46 is compressed by the outer projection 423 and the inner projection 413 after the assembly, the compressed second sealing ring 46 may has the same width as the distance between the outer projection 423 and the inner projection 413. The second sealing ring 46 may be an O-ring of a neoprene/silicon blend elastomeric material of circular, shape, and may be hollow or solid.

In some embodiments, as shown in FIG. 5, a middle channel 424 and an upper channel 425 are formed in the supporting part 42. The middle channel 424 and the upper channel 425 extend along the rotation axis R of the movable clamping member M1. A width of the middle channel 424 is substantially the same as a width of the lower channel 412, and a width of the upper channel 425 is greater than the width of the middle channel 424.

In some embodiments, the abutment member 44 includes a pillar 441 and a ridge 442. The pillar 441 is positioned on a top surface of the supporting part 42 and is located offset from the rotation axis R of the movable clamping member M1. The ridge 442 is positioned adjacent to the pillar 441 and has an inclined surface 443. The inclined surface 443 is configured for clamping the edge of the semiconductor wafer 5. When the movable clamping mechanism M1 is in a closed position, the distance between the inclined surface 443 and the center of the spin base C (FIG. 1) is substantially equal to a radius of the semiconductor wafer 5.

In some embodiments, in assembly, the first sealing ring 45 surrounds the flange 211. Afterwards, the mounting part 41 is positioned on the flange 211. When the mounting part 41 is positioned on the flange 211, the bottom surface 410 of the mounting part 41 is in contact with the flange 211 and the first sealing ring 45, and the rotatable spindle 22 passes through the lower channel 412. Afterwards, the supporting part 42 is positioned on the mounting part 41. When the supporting part 42 is positioned on the mounting part 41, the conical projection 421 of the supporting part 42 is located in a spaced defined by the inner projection 413, and the outer side wall of the conical projection 421 is in contact with the inner side wall of the inner projection 413.

The second sealing ring 45 may surround the inner projection 413 before the supporting part 42 is positioned on the mounting part 41. Alternatively, the second sealing ring 45 is mounted on the inner side wall of the outer projection 423 in advance, and the supporting part 42 and the second sealing ring 45 are together positioned on the mounting part 41. In some embodiments, because the second sealing ring 46 is pressed by both the outer projection 423 and the inner projection 422, a tight fit is created thereby.

After the supporting part 42 is connected to the mounting part 41, the rotatable spindle 22 passes through the middle channel 424 with its one end located in the upper channel 425. The fastening unit 47, such as screw, is positioned in the upper channel 425 and connected to the end of the rotatable spindle 22 so as to affix the mounting part 41 and the supporting part 42 to the spin base 21. Afterwards, the upper channel 425 is covered by the cover 43 to isolate the space defined by the through hole 210, the lower channel 412, the middle channel 424 and the upper channel 42 from the outside of the movable clamping member M1. Since the movable clamping member M1 is affixed to the rotatable spindle 22, when the rotatable spindle 22 is rotated, the rotation angel of the movable clamping member M1 is changed.

Figure 6:
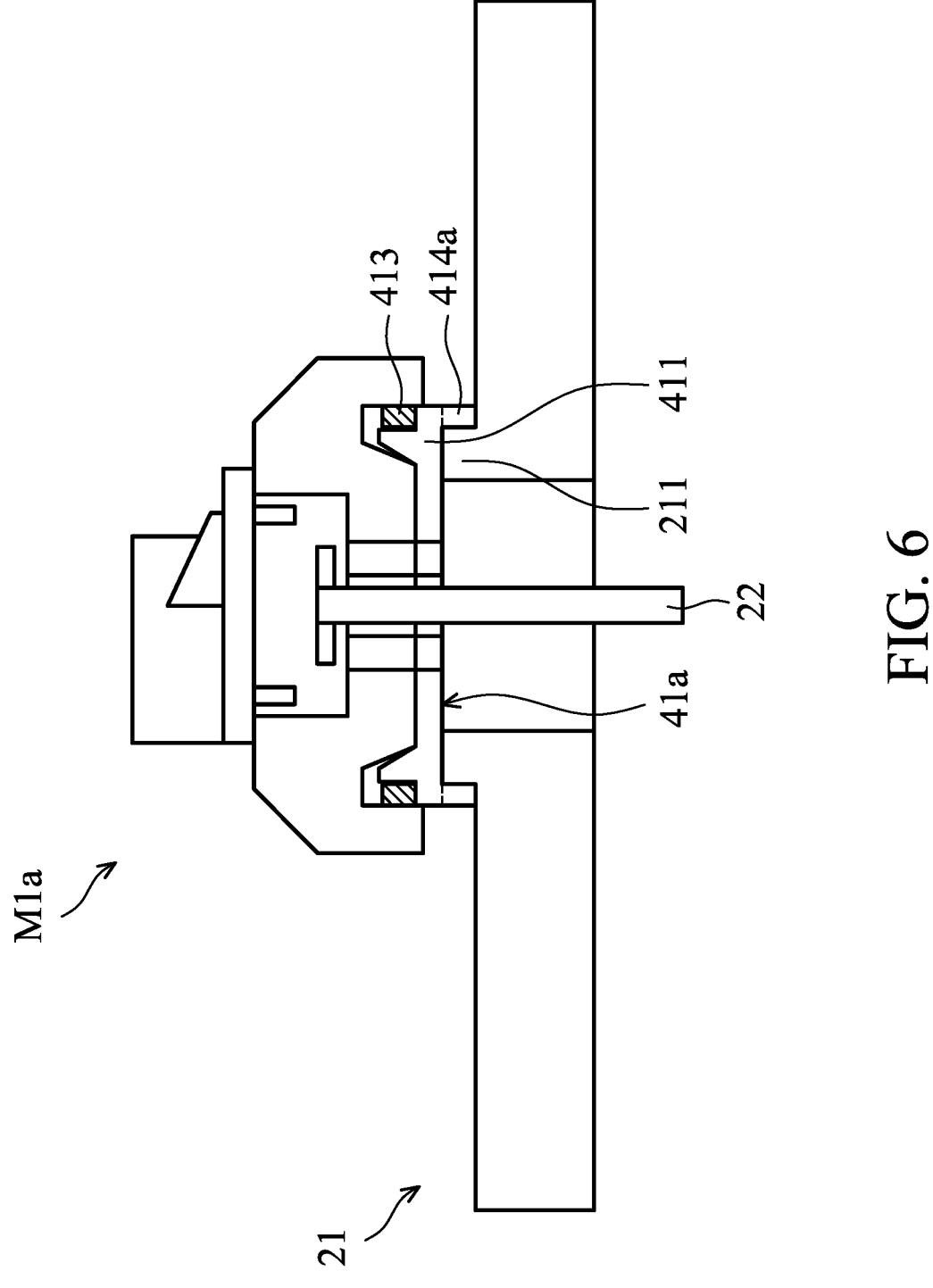
FIG. 6 shows a cross-sectional view of a clamping member, a portion of a spin base and a rotatable spindle, in accordance with some embodiments.

FIG. 6 shows a cross-sectional view of a movable clamping member M1a, a portion of the spin base 21 and the rotatable spindle 22, in accordance with some embodiments. In the embodiments shown in FIG. 6, elements that are similar to those shown in FIG. 5 are provided with the same reference numbers, and the features thereof are not reiterated in the interests of brevity. In some embodiments, differences between the clamping member M1 and the clamping member M1a include the first sealing ring 45 being omitted and the mounting part 41a further including a sealing ring 414a.

In some embodiments, the sealing ring 414a is formed integrally with the base plate 411 via suitable method, such as double injection molding. The sealing ring 414a may be made of material that is different from that of the base plate 411. The outer side wall of the base plate 411 may be flush with the sealing ring 414a. Alternatively, the outer side wall of the base plate 411 may be located farther away from the rotatable spindle 22 than the sealing ring 414a 45.

It should be appreciated that the configurations of the sealing ring to block the gap 48 should not be limited to the above-mentioned embodiments. In some embodiments, the sealing ring is positioned on a shielding region IR of a top surface 215 of the spin base 21. The shielding region IR extends from an inner wall 212 of the through hole 210 to an orthogonal projection of an outermost side wall 425 of the movable clamping member M1 on the top surface 215. For example, as shown in FIG. 5, the sealing ring 45 configured for blocking the gap 48 is positioned on the intermediate region IR of the top surface 215.

Figure 7:
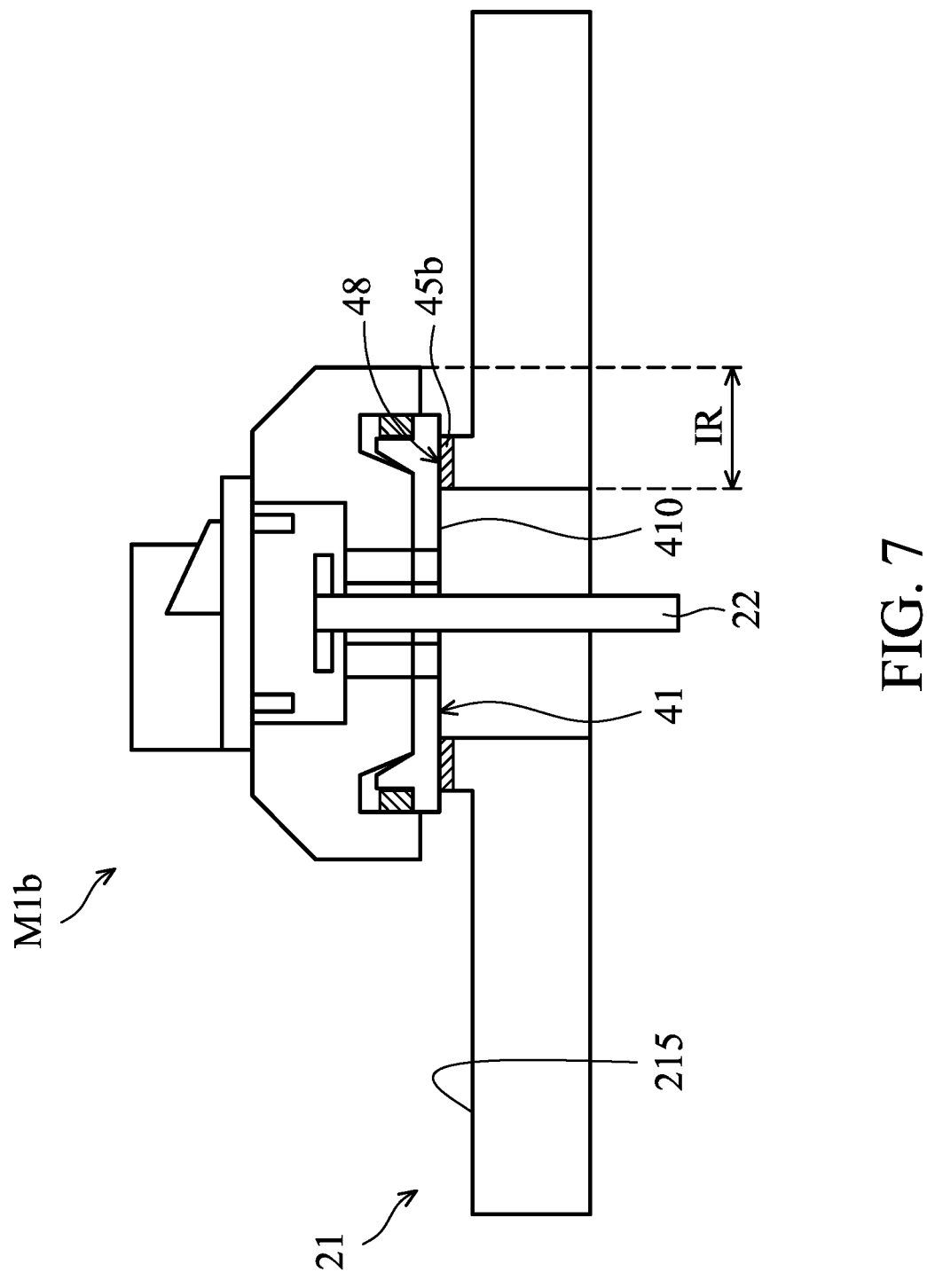
FIG. 7 shows a cross-sectional view of a clamping member, a portion of a spin base and a rotatable spindle, in accordance with some embodiments.

For another example, as shown in FIG. 7, the movable clamping mechanism M1b includes a sealing ring 45b. The sealing ring 45b is positioned on the intermediate region IR of the top surface 215 of the spin base 21. More particularly, the first sealing ring 45b is located in the gap 48 and sandwiched by the bottom surface 410 of the mounting part 41 and the top surface 215 of the spin base 21.

Figure 8:
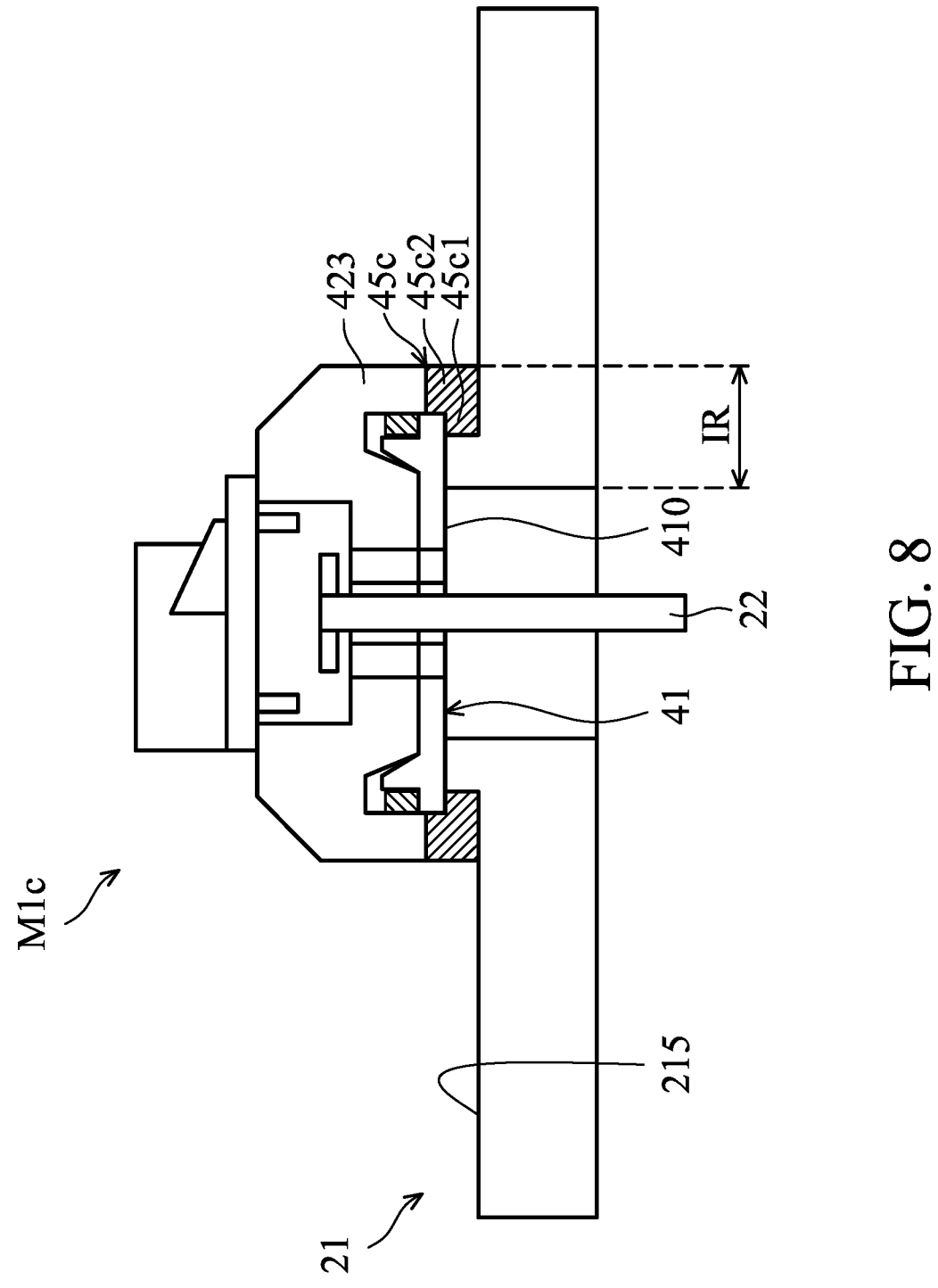
FIG. 8 shows a cross-sectional view of a clamping member, a portion of a spin base and a rotatable spindle, in accordance with some embodiments.

In further another example, as shown in FIG. 8, the movable clamping mechanism M1b includes a sealing ring 45c. The sealing ring 45b is positioned on the intermediate region IR of the top surface 215 of the spin base 21. More particularly, the sealing ring 45c includes an inner portion 45c1 and an outer portion 45c2. The inner portion 45c1 has a ring shape and is sandwiched between the bottom surface 410 of the mounting part 41 and the top surface 215 of the spin base 21. The outer portion 45c2 has a ring shape and is connected to an outer side wall of the inner portion 45c1. The outer portion 45c2 is sandwiched between the outer projection 423 of the supporting part 42 and the top surface 215 of the spin base 21.

In some embodiments, the structural features of fixed clamping member F1, fixed clamping member F2, and movable clamping member M2 may be similar to that of movable claiming member M2. Therefore, the structural features of fixed clamping member F1, fixed clamping member F2, and movable clamping member M2 are not repeated for brevity.

Referring back to FIG. 1, the transferring module 12 is configured to move the supply units. The transferring module 12 includes one or more driving elements 121, and a robot arm 122, in accordance with some embodiments. The driving element 121, such as a motor, is controlled by the control module and is coupled to the robot arm 122. The robot arm 122 is driven by the driving element to provide both radial and rotational movement in a fixed plane to move the first supply units 13 and 14 from one location within the processing system 1 to another.

For example, with the transferring module 12, the first and second supply units 13 and 14 are transferred from a peripheral region of the processing system 1 to a central region of the processing system 1. At the peripheral region, the first supply units 13 and 14 are not positioned above the semiconductor wafer 5. At the center region, the first and second supply units 13 and 14 are positioned above the semiconductor wafer 5. Namely, the projections of the outlets for supply cleaning material of the first supply units 13 and 14 are located above the semiconductor wafer 5.

In some embodiments, the first supply unit 13 is mounted on the transferring module 12 and configured to supply a first cleaning liquid to the semiconductor wafer 5. The first cleaning liquid may include an aggregate of two or more substances. Several examples of the mixture are described below. For example, the first cleaning liquid is a SC1 solution mixed with substances including $NH_4OH$, $H_2O_2$, and $H_2O$ in a selected ratio. The SC1 solution may be used to clean the wafer and to remove the organic compound and particulate matter that attaches to the substrate surface. Alternatively, the first cleaning liquid may be a SC2 solution, mixed with a substance including HCl, $H_2O_2$, and $H_2O$ in a selected ratio. The SC2 solution may be used to clean the wafer and to remove the metal dregs that attach to the wafer surface. However, it should be appreciated that many variations and modifications can be made to embodiments of the disclosure.

The second supply unit 14 is mounted on the transferring module 12 and configured to spray a washing liquid to the semiconductor wafer 5. The washing liquid may include an aggregate of two or more substances. Several examples of the mixture are described below. For example, the washing liquid is a SC1 solution. Alternatively, the washing liquid may be a SC2 solution. In some embodiments, the washing liquid stored in the cleaning material source 22 includes $CO_2$ water.

The shield plate 15 is positioned relative to the catch cup 11 and configured to supply liquid to wash the semiconductor wafer 5 or discharge gas to dry the semiconductor wafer 5. In some embodiments, the shield plate 15 is arranged to move along the main axis C. When the shield plate 15 is used to discharge gas, the shield plate 15 is lower to approach the semiconductor wafer 5.

Figure 9:
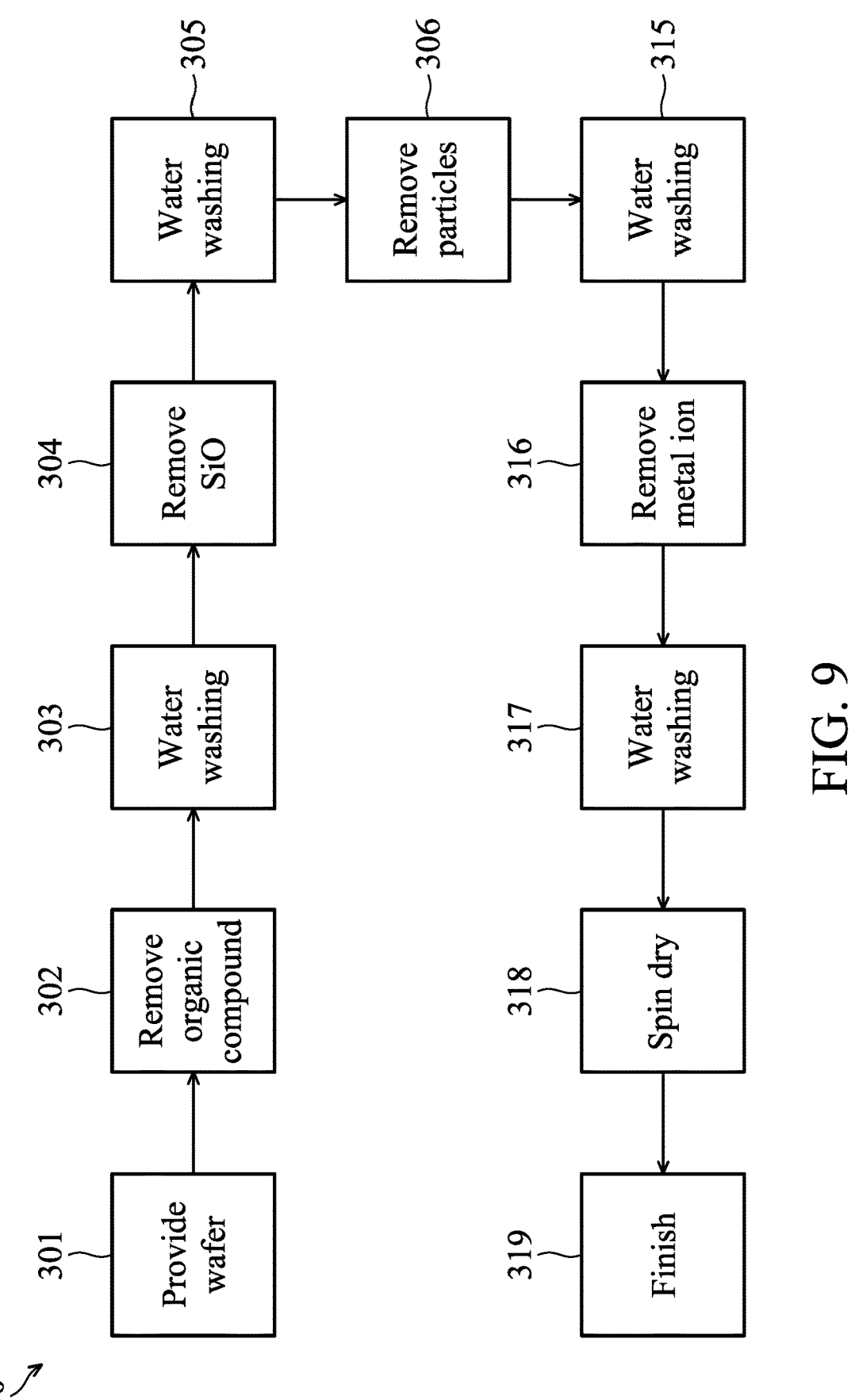
FIG. 9 is a flow chart of a method for supplying plasma material into a processing chamber, in accordance with some embodiments.

FIG. 9 is a flow chart illustrating a method 30 for cleaning a wafer 5, in accordance with some embodiments. For illustration, the flow chart will be described along with the schematic views shown in FIGS. 1-3. Some of the stages described can be replaced or eliminated for different embodiments.

The semiconductor wafer 5 may be made of silicon or other semiconductor materials. Alternatively or additionally, the semiconductor wafer 5 may include other elementary semiconductor materials such as germanium (Ge). In some embodiments, the semiconductor wafer 5 is made of a compound semiconductor such as silicon carbide (SiC), gallium arsenic (GaAs), indium arsenide (InAs), or indium phosphide (InP). In some embodiments, the semiconductor wafer 5 is made of an alloy semiconductor such as silicon germanium (SiGe), silicon germanium carbide (SiGeC), gallium arsenic phosphide (GaAsP), or gallium indium phosphide (GaInP). In some embodiments, the semiconductor wafer 5 includes an epitaxial layer. For example, the semiconductor wafer 5 has an epitaxial layer overlying a bulk semiconductor. In some other embodiments, the semiconductor wafer 5 may be a silicon-on-insulator (SOI) or a germanium-on-insulator (GOI) substrate.

The semiconductor wafer 5 may have various device elements. Examples of device elements that are formed in the semiconductor wafer 5 include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes.

The method 30 includes operation 301, in which a wafer (such as wafer 5), to be cleaned is delivered into a processing system (such as processing system 1). In some embodiments, as shown in FIG. 2, before the semiconductor wafer 5 is moved into the processing system 1, the movable clamping members M1 and M2 are moved to the open position. Afterwards, the semiconductor wafer 5 is placed on fixed clamping member F1, fixed clamping member F2, movable clamping member M1 and movable clamping member M2. The edge of the semiconductor wafer 5 is abutted against the abutment members 44 of the fixed clamping members F1 and F2.

Afterwards, the rotatable spindles 22 are rotated about the rotation axis R (FIG. 5) by the driving members 24 so as to move the movable clamping members M1 and M2 to the closed position as shown in FIG. 3. When the movable clamping members M1 and M2 are in the closed position, the edge of the semiconductor wafer 5 is abutted against the abutment members 44 of the movable clamping members M1 and M2, fixed clamping member F1, and fixed clamping member F2. The movable clamping members M1 and M2 will be kept in the closed position during the wafer cleaning process, and thus the semiconductor wafer 5 is constantly stably held during the wafer cleaning process.

In some embodiments, after operation 301 and before the semiconductor wafer 5 is cleaned by the cleaning liquid, the rotation angle of the rotatable spindles 22 are measured so as to make sure the semiconductor wafer 5 is securely held. Specifically, when the operation of the driving members 24 is finished, a sensor (not shown in figures) is used to measure the rotation angle of the rotatable spindles 22 or another transmission element which is used to drive the rotation of the rotatable spindles 22.

Afterwards, the measured angles are transmitted to a computer (not shown in figures) for analysis. The computer may compare the measured angle with a predetermined value. If the measured angle is greater than the predetermined value, the computer may determine that the wafer is not located on the clamping members or the semiconductor wafer 5 is cracked due to overrunning of the clamping members, and an alarm condition is triggered to inform maintenance personnel to properly handle it. If the measured angle is less than the predetermined value, the computer may determine that the wafer is not securely locked, and an alarm condition is triggered to inform maintenance personnel to properly handle it.

Since the rotatable spindle is protected by the sealing rings from being damaged by the cleaning liquid or washing liquid, this mitigates problems with the rotation angle not being able to be controlled accurately due to spindle corrosion. Therefore, the rotation angle can be precisely measured, and the chance of a false alarm event will be reduced.

In operation 302, an organic compound on the semiconductor wafer 5 is removed by supplying, for example, ozone ($O_3$) to both the front and back surface of the semiconductor wafer 5. In operation 303, the semiconductor wafer 5 is washed with liquid, such as $CO_2$ water, to remove ozone used in operation 31. In operation 304, silicon dioxide ($SiO_2$) on the semiconductor wafer 5 is removed by supplying, for example, Hydrogen fluoride (HF) to both the front and back surface of the semiconductor wafer 5. In operation 305, the semiconductor wafer 5 is once again washed with liquid, such as $CO_2$ water, to remove HF used in operation 305. In operation 306, a cleaning process is performed so as to remove particles and/or contaminants on the semiconductor wafer 5, in which the SC2 solution and a washing spray are alternately sprayed over the wafer multiple times.

In operation 315, the semiconductor wafer 5 is once again washed with liquid, such as $CO_2$ water, to remove the cleaning solution 210 and the washing spray 240 used in operation 306. In operation 316, metal ions on the semiconductor wafer 5 are removed by supplying, for example, SC2 solution to both the front and back surface of the semiconductor wafer 5. In some embodiments, the operation 316 includes a cleaning process such as the one performed in operation 306, in which the SC2 solution and a washing spray are alternately sprayed over the wafer multiple times.

In operation 317, the semiconductor wafer 5 is once again washed with liquid, such as $CO_2$ water, to remove the SC2 solution used in operation 316. The liquid may be supplied from the shield plate 15. In operation 318, the semiconductor wafer 5 is dried by spinning the semiconductor wafer 5 and supplying dry gas, such as nitrogen gas, over the semiconductor wafer 5 from the shield plate 15. The shield plate 15 may be lowered to close the semiconductor wafer 5 as the dry gas is being supplied. The method 30 continues with operation 319 where the cleaning of the semiconductor wafer 5 is completed.

Embodiments of a method and apparatus for cleaning a semiconductor wafer utilize a number of clamping mechanisms for fixing the semiconductor wafer. At least one sealing ring is positioned at the bottom surface of the clamping mechanism to block cleaning liquids from flowing into a through hole in which a spindle for fixing the clamping mechanism is located. Because the spindle is not contaminated by the corrosive cleaning liquids, the lifespan of the spindle is extended. Therefore, it is possible to reduce the labor required for maintenance of the cleaning apparatus, thereby reducing the manufacturing cost.

A semiconductor wafer cleaning apparatus is provided in come embodiments of the present disclosure. The semiconductor wafer cleaning apparatus includes a spin base, a spindle extending through the spin base, and a clamping member covering the spin base. The spindle includes a mounting part and a supporting part disposed on the mounting part. The mounting part includes an inner projection, the supporting part includes a conical projection, and the conical projection is surrounded by the inner projection. The semiconductor wafer cleaning apparatus further includes a first sealing ring disposed between the spin base and the mounting part.

A semiconductor wafer cleaning apparatus is provided in come embodiments of the present disclosure. The semiconductor wafer cleaning apparatus includes a spin base, a spindle extending through the spin base, and a clamping member covering the spin base. The clamping member includes a mounting part and a supporting part disposed on the mounting part, wherein the mounting part includes a base plate and an inner projection protruding from the base plate. The semiconductor wafer cleaning apparatus further includes a sealing ring disposed between the mounting part and the supporting part, wherein the base plate and the inner projection are in contact with different sides of the sealing ring.

A semiconductor wafer cleaning apparatus is provided in come embodiments of the present disclosure. The semiconductor wafer cleaning apparatus includes a spin base having a bottom and a flange protruding from the bottom, a spindle extending through the spin base, a clamping member covering the spin base, and a first sealing ring disposed under the base plate. The first sealing ring is in contact with the flange and spaced apart from the bottom.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A semiconductor wafer cleaning apparatus, comprising:
a spin base;
a spindle extending through the spin base;
a clamping member covering the spin base, comprising a mounting part and a supporting part disposed on the mounting part, wherein the mounting part comprises an inner projection, the supporting part comprises a conical projection and an outer projection, the conical projection is surrounded by the inner projection, and the outer projection surrounding the conical projection and the inner projection; and
a first sealing ring disposed between the spin base and the mounting part.

2. The semiconductor wafer cleaning apparatus as claimed in claim 1, further comprising a second sealing ring disposed between the outer projection and the inner projection.

3. The semiconductor wafer cleaning apparatus as claimed in claim 2, wherein the inner projection is higher than the second sealing ring.

4. The semiconductor wafer cleaning apparatus as claimed in claim 2, wherein the second sealing ring is spaced apart from a bottom surface of the supporting part.

5. The semiconductor wafer cleaning apparatus as claimed in claim 1, wherein a gap is between the inner projection and the conical projection.

6. The semiconductor wafer cleaning apparatus as claimed in claim 1, wherein the spin base comprises a flange protruding toward the supporting part, and the first sealing ring is disposed between the flange and the mounting part.

7. The semiconductor wafer cleaning apparatus as claimed in claim 6, wherein the mounting part comprises a base plate extending beyond the first sealing ring and the flange.

8. A semiconductor wafer cleaning apparatus, comprising:
a spin base;
a spindle extending through the spin base;
a clamping member covering the spin base, comprising a mounting part and a supporting part disposed on the mounting part, wherein the mounting part comprises a base plate and an inner projection protruding from the base plate, and the supporting part comprises an outer projection surrounding the mounting part; and
a sealing ring disposed between the mounting part and the supporting part, wherein the base plate and the inner projection are in contact with different sides of the sealing ring, and the sealing ring and the base plate are in contact with the outer projection.

9. The semiconductor wafer cleaning apparatus as claimed in claim 8, wherein the supporting part further comprises a conical projection, and the sealing ring is disposed between the conical projection and the outer projection.

10. The semiconductor wafer cleaning apparatus as claimed in claim 9, wherein the sealing ring is spaced apart from the conical projection by the inner projection.

11. The semiconductor wafer cleaning apparatus as claimed in claim 9, wherein the conical projection is in contact with base plate.

12. The semiconductor wafer cleaning apparatus as claimed in claim 11, wherein a gap is between the conical projection and the inner projection.

13. A semiconductor wafer cleaning apparatus, comprising:
a spin base, comprising a bottom and a flange protruding from the bottom;
a spindle extending through the spin base;
a clamping member covering the spin base and comprising a mounting part and a supporting part, wherein the mounting part comprises a base plate, the supporting part comprises a conical projection and an outer projection, and the outer projection surrounds the mounting part and the conical projection; and
a first sealing ring disposed under the base plate, wherein the first sealing ring is in contact with the flange and spaced apart from the bottom.

14. The semiconductor wafer cleaning apparatus as claimed in claim 13, wherein a bottom surface of the mounting part is in contact with the first sealing ring.

15. The semiconductor wafer cleaning apparatus as claimed in claim 14, wherein the bottom surface is partially exposed from the first sealing ring.

16. The semiconductor wafer cleaning apparatus as claimed in claim 14, wherein the bottom surface is spaced apart from the flange by the first sealing ring.

17. The semiconductor wafer cleaning apparatus as claimed in claim 13, wherein the flange is partially exposed from the first sealing ring.

18. The semiconductor wafer cleaning apparatus as claimed in claim 13, wherein a sidewall of the first sealing ring is aligned with a sidewall of the flange.

19. The semiconductor wafer cleaning apparatus as claimed in claim 13, wherein the mounting part comprises an inner projection surrounding the conical projection and surrounded by the outer projection.

20. The semiconductor wafer cleaning apparatus as claimed in claim 19, wherein the first sealing ring is disposed between the inner projection and the outer projection.

* * * * *